(12) United States Patent
Chen et al.

(10) Patent No.: US 12,266,566 B2
(45) Date of Patent: Apr. 1, 2025

(54) CONTACT RESISTANCE BETWEEN VIA AND CONDUCTIVE LINE

(71) Applicant: Taiwan Semiconductor Manufacturing Co., Ltd., Hsin-Chu (TW)

(72) Inventors: Chun-Yuan Chen, Hsinchu (TW);
Shih-Chuan Chiu, Hsinchu (TW);
Jia-Chuan You, Taoyuan County (TW);
Chia-Hao Chang, Hsinchu (TW);
Tien-Lu Lin, Hsinchu County (TW);
Yu-Ming Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 58 days.

(21) Appl. No.: 18/447,084

(22) Filed: Aug. 9, 2023

(65) Prior Publication Data

US 2023/0386911 A1    Nov. 30, 2023

Related U.S. Application Data

(62) Division of application No. 17/745,127, filed on May 16, 2022, now Pat. No. 12,009,254, which is a division of application No. 16/573,719, filed on Sep. 17, 2019, now Pat. No. 11,335,592.

(51) Int. Cl.
| | | |
|---|---|---|
| *H01L 23/522* | (2006.01) | |
| *H01L 21/321* | (2006.01) | |
| *H01L 21/768* | (2006.01) | |
| *H01L 23/528* | (2006.01) | |
| *H01L 23/532* | (2006.01) | |

(52) U.S. Cl.
CPC ...... *H01L 21/7684* (2013.01); *H01L 21/3212* (2013.01); *H01L 21/76802* (2013.01); *H01L 21/76883* (2013.01); *H01L 23/5226* (2013.01); *H01L 23/53209* (2013.01)

(58) Field of Classification Search
CPC ............ H01L 23/5226; H01L 23/5283; H01L 23/53209; H01L 23/53242; H01L 23/53257; H01L 23/53295
See application file for complete search history.

(56) References Cited

U.S. PATENT DOCUMENTS

| | | |
|---|---|---|
| 6,455,424 B1 | 9/2002 | McTeer et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Omar F Mojaddedi
(74) *Attorney, Agent, or Firm* — HAYNES AND BOONE, LLP

(57) ABSTRACT

A method includes forming a first conductive feature on a substrate, forming a via that contacts the first conductive feature, the via comprising a conductive material, performing a Chemical Mechanical Polishing (CMP) process to a top surface of the via, depositing an Interlayer Dielectric (ILD) layer on the via, forming a trench within the ILD layer to expose the via, and filling the trench with a second conductive feature that contacts the via, the second conductive feature comprising a same material as the conductive material.

20 Claims, 8 Drawing Sheets

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,515,021 B1* | 12/2016 | Chen | H01L 23/53295 |
| 9,520,482 B1 | 12/2016 | Chang et al. | |
| 9,576,814 B2 | 2/2017 | Wu et al. | |
| 11,056,426 B2* | 7/2021 | Mignot | H01L 23/528 |
| 2002/0168830 A1 | 11/2002 | DeBoer et al. | |
| 2003/0134521 A1* | 7/2003 | Guo | H01L 21/31116 |
| | | | 257/E21.252 |
| 2004/0048468 A1* | 3/2004 | Liu | H01L 21/76865 |
| | | | 257/E21.585 |
| 2010/0207241 A1 | 8/2010 | Yoon et al. | |
| 2015/0162280 A1 | 6/2015 | Pan et al. | |
| 2015/0318243 A1 | 11/2015 | Lin et al. | |
| 2016/0111325 A1* | 4/2016 | JangJian | H01L 23/53295 |
| | | | 257/774 |
| 2016/0365271 A1* | 12/2016 | Chang | H01L 23/485 |
| 2017/0110397 A1 | 4/2017 | Wu et al. | |
| 2018/0130699 A1* | 5/2018 | Zhang | H01L 23/53209 |
| 2018/0261546 A1 | 9/2018 | Bark et al. | |
| 2020/0381354 A1 | 12/2020 | Mignot et al. | |
| 2020/0388567 A1* | 12/2020 | Mignot | H01L 23/5226 |
| 2021/0082742 A1 | 3/2021 | Chen et al. | |

* cited by examiner

CONTACT RESISTANCE BETWEEN VIA AND CONDUCTIVE LINE

PRIORITY DATA

The present application is a divisional application of U.S. patent application Ser. No. 17/745,127, filed May 16, 2022, which is a divisional application of U.S. patent application Ser. No. 16/573,719, filed Sep. 17, 2019, each of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC structures (such as three-dimensional transistors) and processing and, for these advancements to be realized, similar developments in IC processing and manufacturing are needed. For example, device performance (such as device performance degradation associated with various defects) and fabrication cost of field-effect transistors become more challenging when device sizes continue to decrease. Although methods for addressing such a challenge have been generally adequate, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
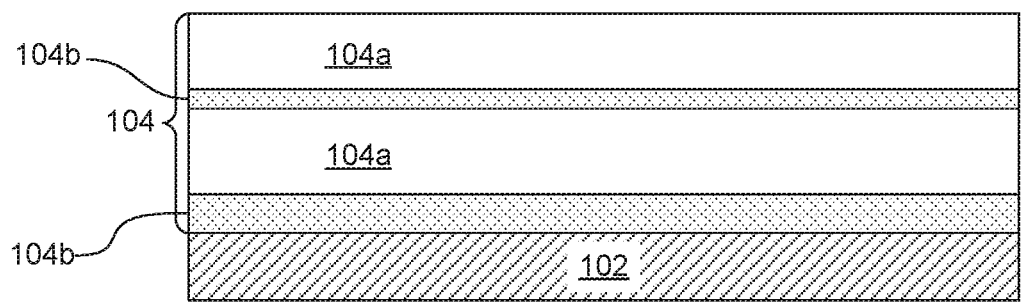
FIGS. 1A, 1B, 1C, 1D, 1E, 1F, 1G, 1H, 1I, and 1J are diagrams showing an illustrative process for forming a via and conductive line with an improved contact resistance between the two, according to one example of principles described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices and the fabrication thereof, and more particularly to semiconductor devices with improved resistance between a via and a conductive feature.

In conventional semiconductor fabrication processes, the Back End of Line (BEOL) involves the formation of several dielectric layers, each dielectric layer having conductive lines (e.g., metal lines) disposed therein. The metal lines disposed within one dielectric layer are connected to metal lines disposed within another dielectric layer through a via. A via is formed by depositing a conductive material, such as copper or tungsten within a trench formed into a dielectric layer. Then, a subsequent dielectric layer is formed, and patterned to form another trench that exposes the underlying via. Another conductive material is then deposited into the recently formed trench to form a metal line. To avoid the metal layer from diffusing into the dielectric layer, a barrier layer (often made of titanium nitride or tantalum nitride) is then disposed within the recently formed trench before the metal material is deposited therein. This barrier layer, however, adds resistance to the interface between the via and the conductive line. In some instances, multiple layers are between the metal layer and dielectric layer, such as a glue layer (also called as an adhesion layer, in some instances) and a barrier layer. It is desirable to improve this resistance by reducing or eliminating it.

According to principles described herein, the contact resistance between a via and a conductive line is improved by reducing or eliminating the interface between the via and the conductive line. This may be done by using the same type of conductive material for the via as the conductive line. For example, both the via and the conductive line may both be formed of ruthenium. Ruthenium may be referred to as a barrier-free metal because it is able to be deposited within a dielectric layer without using a barrier layer between the conductive line and the dielectric layer within which it is formed. Using principles described herein, the contact resistance between the via and the conductive line is improved by reducing or eliminating such contact resistance. This allows the circuit to be more efficient and function better.

FIGS. 1A, 1B, 1C, 1D, 1E, 1F, 1G, 1H, 1I, and 1J are diagrams showing an illustrative process for forming a via and conductive line with an improved contact resistance between the two. According to the present example, a semiconductor device includes a substrate 102 and a first dielectric layer 104.

The semiconductor substrate 102 may be a silicon substrate. The semiconductor substrate may be part of a silicon wafer. Other semiconductor materials are contemplated. The substrate 102 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for IC device manufacturing. In one example, the substrate 102 may be a silicon-on-insulator (SOI) substrate having a silicon layer formed on a silicon oxide layer. In another example, the substrate 102 may include a conductive layer, a semiconductor layer, a dielectric layer, other layers, or combinations thereof.

The dielectric layer 104 includes two types of sublayers. In one example, the first sublayer 104a is silicon dioxide and the second sublayer 104b is silicon nitride. Other types of dielectric materials are contemplated. The dielectric layer 104 (and thus the sublayers 104a, 104b) may be formed through various deposition processes.

Figure 1B:
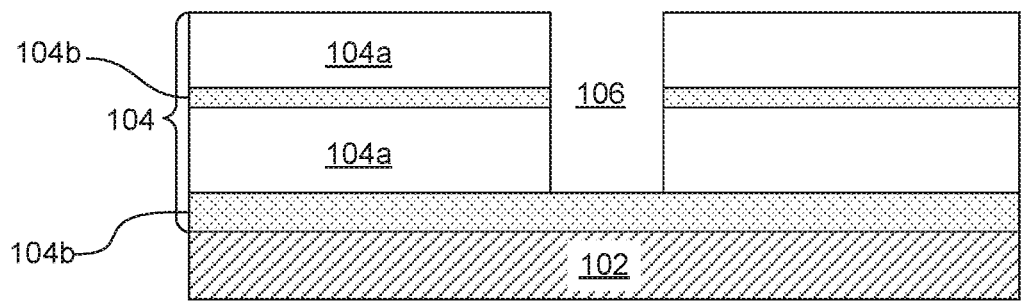

FIG. 1B illustrates the formation of a trench 106 within the first dielectric layer 104. The trench 106 may be formed using photolithographic patterning techniques. For example, in the present example, the trench is formed by lithography patterning and etching. A photoresist (or resist) layer used to define the trench may be formed on the first dielectric layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning or lithography process. In one embodiment, the resist layer is patterned to leave the portions of the photoresist material by the lithography patterning process. After patterning the resist layer, an etching process is performed on the semiconductor structure to open the first dielectric layer 104 and form the trench 106, thereby transferring the openings from the resist layer to the first dielectric layer. The remaining resist layer may be removed after patterning the first dielectric layer by wet stripping or plasma ashing. In some examples, a lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the first dielectric layer 104 may include wet etching, dry etching or a combination thereof. The etching process may include multiple etching steps.

Figure 1C:
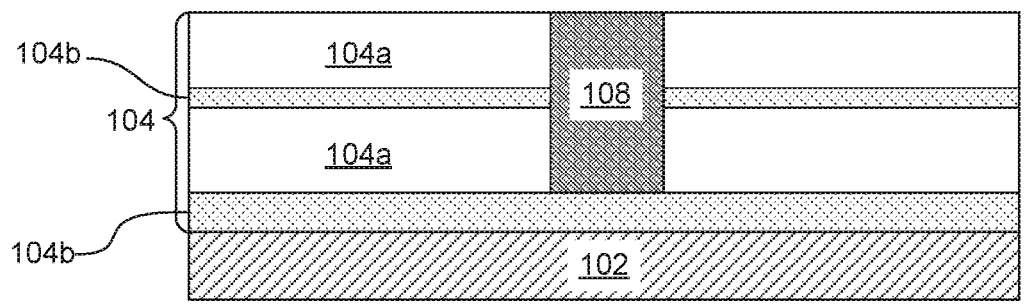

FIG. 1C illustrates the formation of a first conductive feature 108 within the first dielectric layer 104. The first conductive feature 108 may be formed in a variety of manners. In one example, the first conductive feature 108 is formed by depositing a metal material, such as tungsten, within the trench 106. A Chemical Mechanical Polishing (CMP) process may then be applied to the deposited metal material to planarize the top surface of the conductive feature 108 with the top surface of the first dielectric layer 104.

Although not shown in FIG. 1C, the first conductive feature 108 may be electrically connected to a feature within the substrate 102 through a via (also not shown). For example, the first conductive feature may be connected to a source, drain, or gate feature of a transistor within the substrate. In examples in which the substrate includes dielectric layers which are also part of the BEOL, the conductive feature 108 may connect to an underlying conductive feature.

Figure 1D:
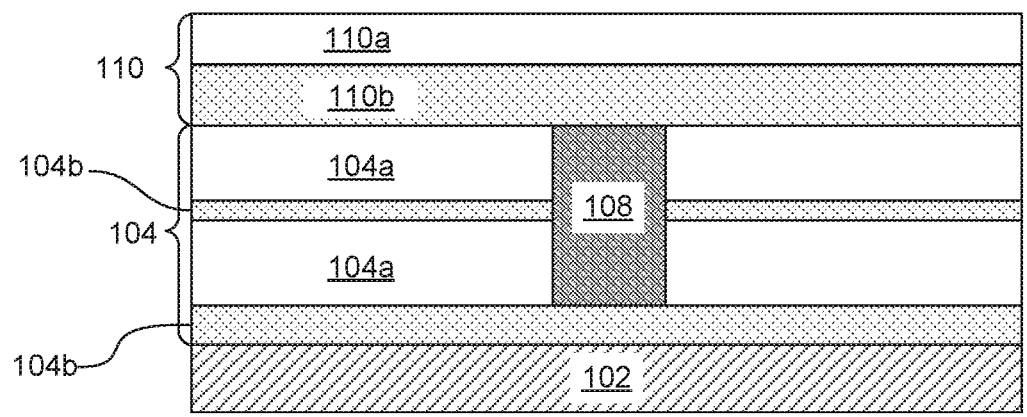

FIG. 1D illustrates the formation of a second dielectric layer 110. The second dielectric layer 110 also includes a number of sublayers 110a, 110b. The first sublayer 110a may be silicon dioxide and the second sublayer 110b may be silicon nitride. Other types of dielectric materials are contemplated. The dielectric layer 110 (and thus the sublayers 110a, 110b) may be formed through various deposition processes.

Figure 1E:
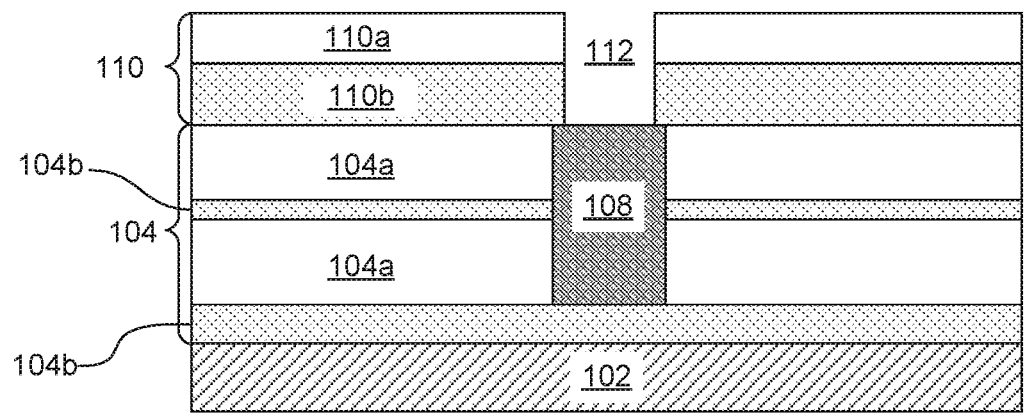

FIG. 1E illustrates the formation of a trench 112 within the second dielectric layer 110. The trench 112 may be formed using photolithographic patterning techniques. For example, in the present example, the trench is formed by lithography patterning and etching. A photoresist (or resist) layer used to define the trench may be formed on the first dielectric layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning or lithography process. In one embodiment, the resist layer is patterned to leave the portions of the photoresist material by the lithography patterning process. After patterning the resist layer, an etching process is performed on the semiconductor structure to open the second dielectric layer 110 and form the trench 112, thereby transferring the openings from the resist layer to the first dielectric layer. The remaining resist layer may be removed after patterning the first dielectric layer by wet stripping or plasma ashing. In some examples, a lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the second dielectric layer 110 may include wet etching, dry etching or a combination thereof. The etching process may include multiple etching steps.

Figure 1F:
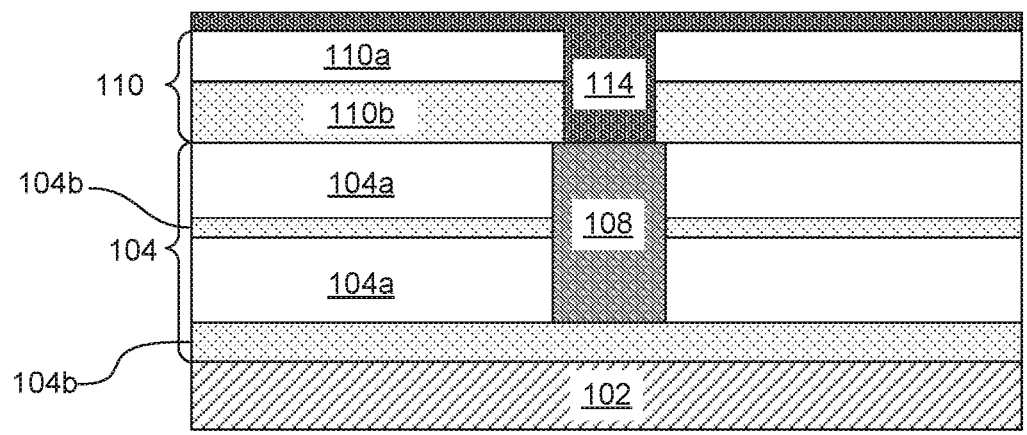

FIG. 1F illustrates the deposition of a conductive material 114 within the trench 112. The conductive material 114 may be one of a variety of metal materials such as ruthenium, tungsten, cobalt, or copper. In one particular example, the conductive material 114 comprises ruthenium. The ruthenium may be deposited using a Chemical Vapor Deposition (CVD) process. The CVD process may use $Ru_3Co_{12}$ as a precursor. The CVD process may be performed at a temperature within a range of about 100-200 degrees Celsius.

This range is ideal for depositing the conductive material within the trench. If the temperature is too high or too low, the conductive material may not form properly. In some examples, other deposition techniques such as Plasma Vapor Deposition (PVD) or Atomic Layer Deposition (ALD) may be used.

Figure 1G:
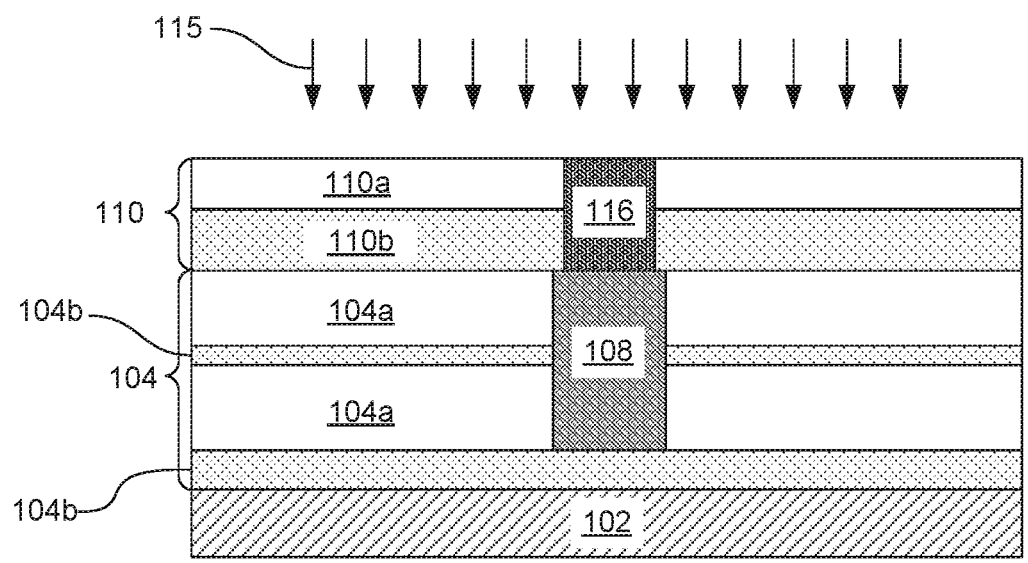

FIG. 1G illustrates a CMP process 115 that is performed on the conductive material to form a via 116. The CMP process planarizes the surface of the water so that the top surface of the via is coplanar with the top surface of the second dielectric layer 110. The via 116 directly contacts the underlying feature 108 and thus provides an electrical connection to the underlying conductive feature 108. After the CMP process, the via 116 may have a height within a range of 10-30 nanometers. The bottom of the via may have a critical dimension with respect to adjacent vias of about 5-15 nanometers.

Figure 1H:
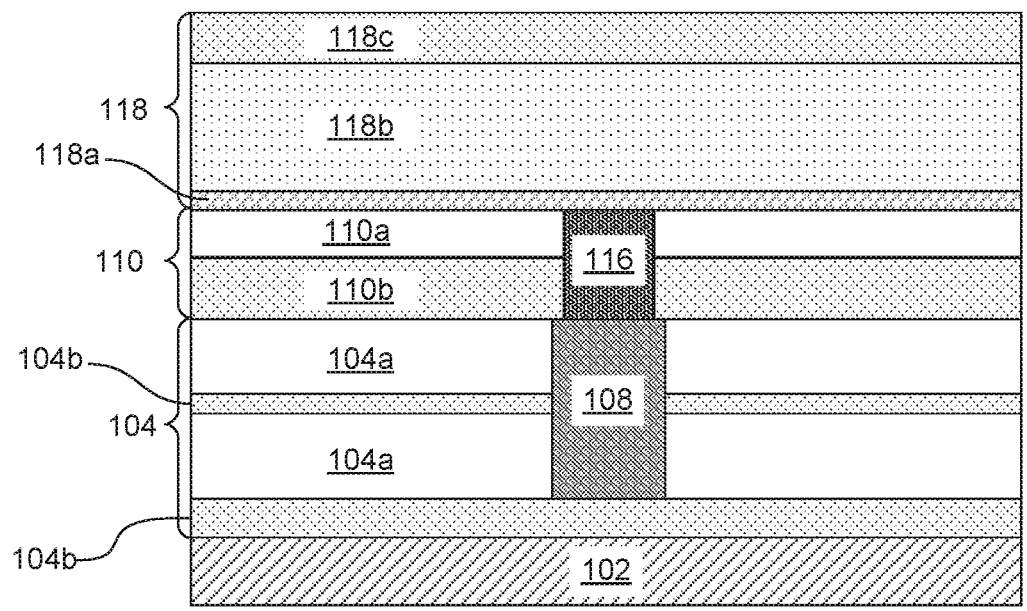

FIG. 1H illustrates the formation of a third dielectric layer 118. The third dielectric layer 118 also comprises several sublayers. In some examples, the third dielectric layer 118 may be referred to as an Interlayer Dielectric (ILD) layer. In the present case, the third dielectric layer comprises an etch stop layer 118a, a low-k dielectric layer 118b, and a hard mask layer 118c. In some examples, the third dielectric layer 118 may include only the etch stop layer 118a and the low-k dielectric layer 118b. In some examples, the third dielectric layer may include only the low-k dielectric layer 118b. The dielectric layer 118 (and thus the sublayers 118a, 118b, 118c) may be formed through various deposition processes.

Figure 1I:
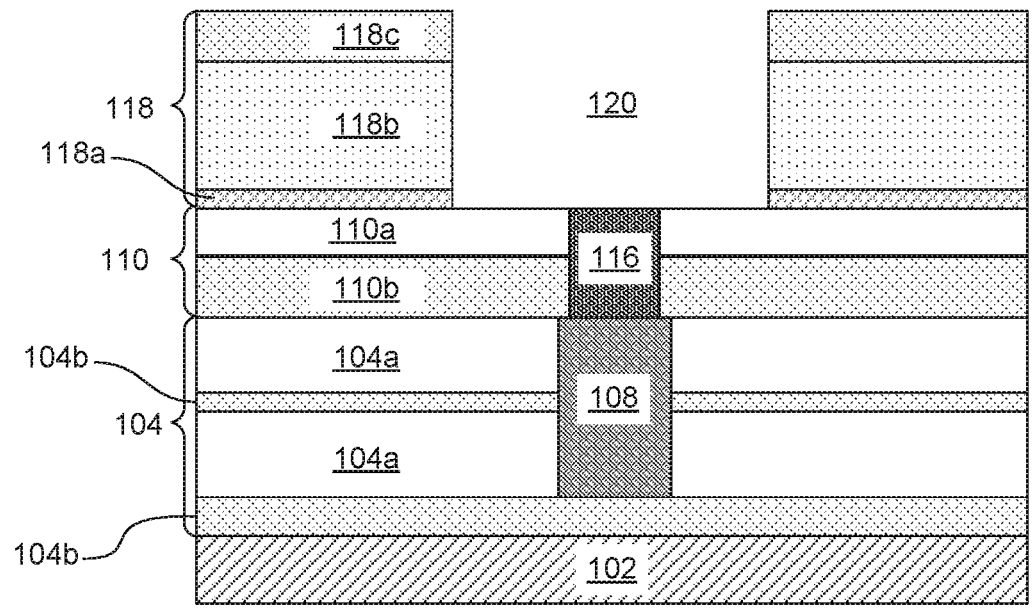

FIG. 1I illustrates the formation of a trench 120 within the third dielectric layer 118. The trench 120 may be formed using photolithographic patterning techniques. For example, in the present example, the trench is formed by lithography patterning and etching. A photoresist (or resist) layer used to define the trench may be formed on the first dielectric layer. A resist layer includes a photosensitive material that causes the layer to undergo a property change when exposed to light, such as ultraviolet (UV) light, deep UV (DUV) light or extreme UV (EUV) light. This property change can be used to selectively remove exposed or unexposed portions of the resist layer by a developing process. This procedure to form a patterned resist layer is also referred to as lithographic patterning or lithography process. In one embodiment, the resist layer is patterned to leave the portions of the photoresist material by the lithography patterning process. After patterning the resist layer, an etching process is performed on the semiconductor structure to open the third dielectric layer 118 and form the trench 120, thereby transferring the openings from the resist layer to the first dielectric layer. The remaining resist layer may be removed after patterning the first dielectric layer by wet stripping or plasma ashing. In some examples, a lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as maskless photolithography, electron-beam writing, and ion-beam writing. The etching process to pattern the third dielectric layer 118 may include wet etching, dry etching or a combination thereof. The etching process may include multiple etching steps.

Figure 1J:
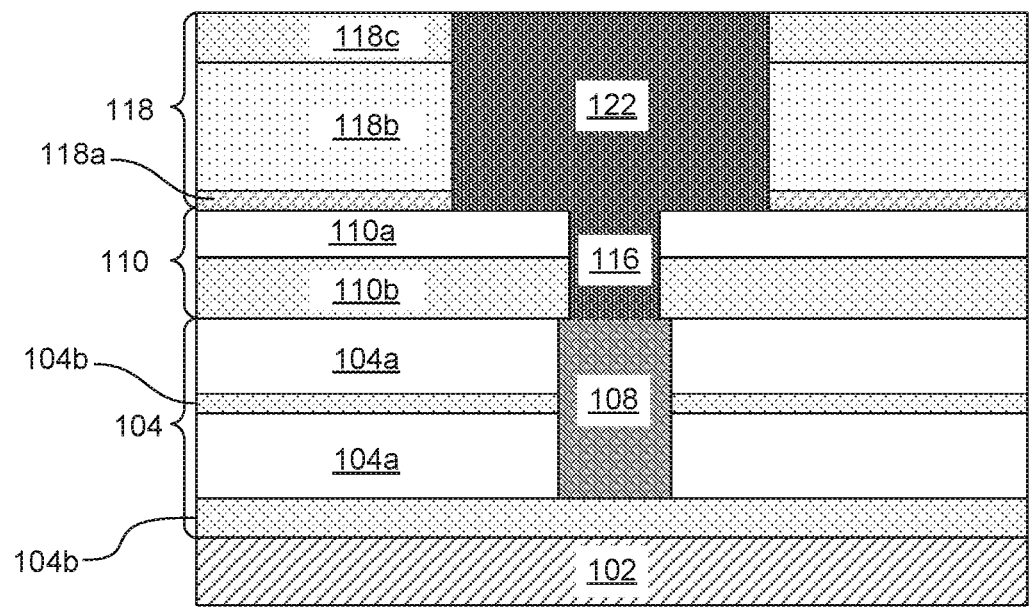

FIG. 1J illustrates the formation of a second conductive feature 122 within the trench 120. The second conductive feature may also be deposited using the same process used to form the via 116. Additionally, the second conductive feature may include the same type of conductive material as the via 116. Specifically, if the via 116 is made of ruthenium, then the second conductive feature 122 may also be made of ruthenium. Ruthenium is one of a number of materials that provides particular advantages in this situation because it can be deposited into the trench 120 without first forming a barrier layer to protect against diffusion of the metal into the third dielectric layer 118. The ruthenium may also adhere well to the surface of the third dielectric layer 118 without having to rely on a barrier or glue layer. By not having a barrier or glue layer, there is no interface between the second conductive feature 122 and the via 116. Without such an interface, the contact resistance between the via 116 and the second conductive feature 122 is reduced or eliminated. In some embodiments, the second conductive feature 122 extends along the direction of the gate feature. In some embodiments, the second conductive feature 122 extends along the direction of a fin structure of a FinFET. In other words, the second conductive feature 122 extends along the direction of the channel feature.

Figure 2:
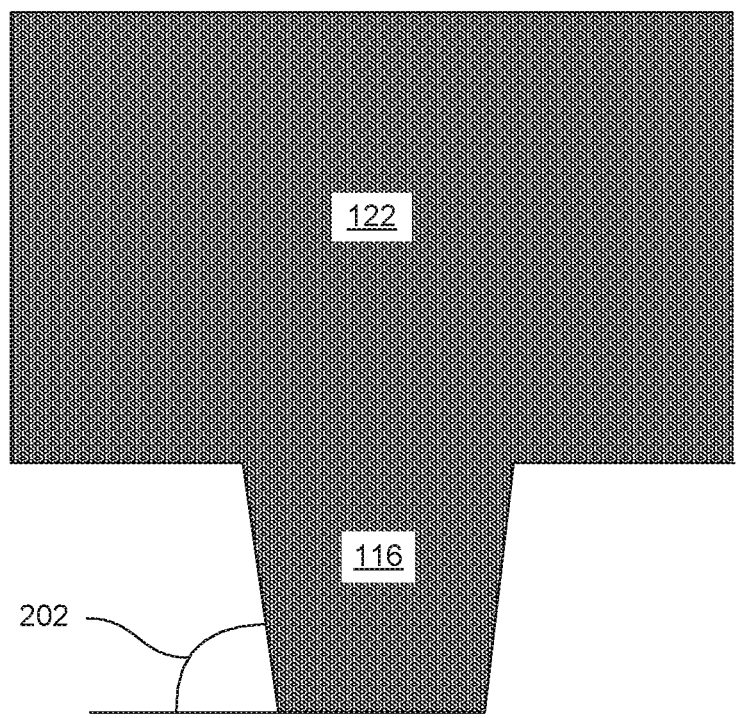
FIG. 2 is a diagram showing a tapering angle of the via, according to one example of principles described herein.

FIG. 2 is a diagram showing a tapering angle of the via. When using principles described herein, the via 116 will be tapered at a relatively steep angle. Specifically, the angle between the bottom surface of the via (or top surface of the underlying conductive feature 108) and the via 116 is greater than 85 degrees. Thus, the structure of the via is different than a structure produced using conventional dual damascene processes. In some embodiments, an interface exists between the via 116 and the second conductive feature 122.

Figure 3A:
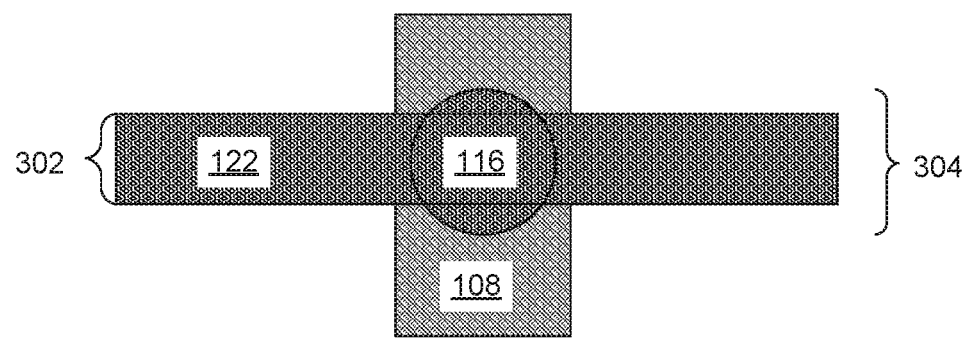
FIGS. 3A, 3B, and 3C are diagrams showing illustrative size relationships between via and conductive line, according to one example of principles described herein.
Figure 3B:
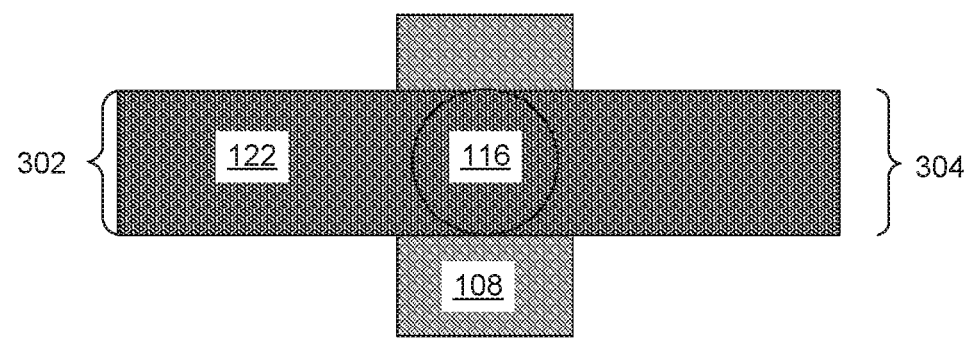
Figure 3C:
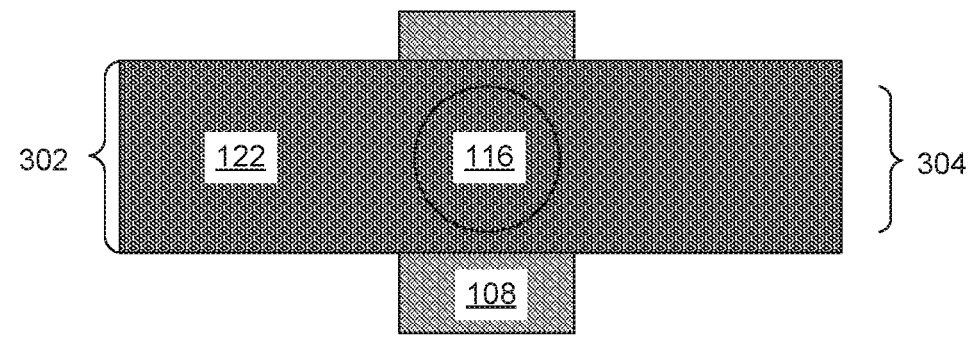

FIGS. 3A, 3B, and 3C are diagrams showing illustrative size relationships between via and conductive line. FIGS. 3A-3C illustrate a top view of the first conductive feature 108, the via 116, and the second conductive feature 122. As can be seen in the example of FIG. 3A, the diameter 304 of the via 116 is greater than the width 302 of the second conductive feature 122. FIG. 3B illustrates an example in which the diameter 304 of the via 116 is similar to the width 302 of the second conductive feature 122. FIG. 3C illustrates an example in which the diameter 304 of the via 116 is less than the width 302 of the second conductive feature 122. In some examples, the second conductive feature 122 may have a length within a range of about 5-150 nanometers.

Figure 4:
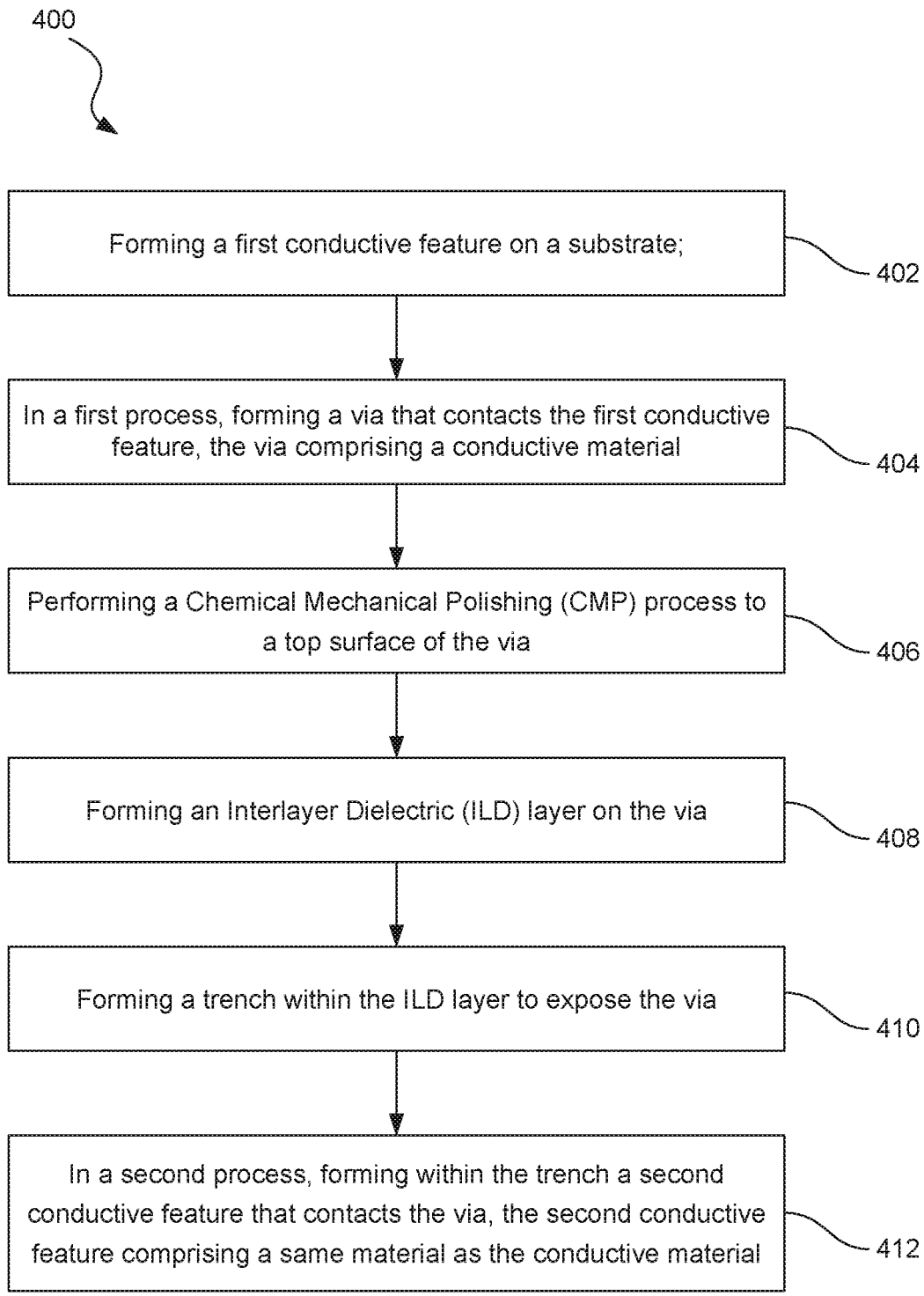
FIG. 4 is a flowchart showing an illustrative method for forming a via and conductive line with an improved contact resistance between the two, according to one example of principles described herein.

FIG. 4 is a flowchart showing an illustrative method 400 for forming a via and conductive line with an improved contact resistance between the two. According to the present example, the method includes a process 402 for forming a first conductive feature (e.g., 108) on a substrate (e.g., 102). More specifically, the first conductive feature may be formed within a dielectric layer that has been deposited on the substrate.

The first conductive feature may be formed in a variety of manners. In one example, the first conductive feature is formed by depositing a metal material, such as tungsten, within a trench. A Chemical Mechanical Polishing (CMP) process may then be applied to the deposited metal material to planarize the top surface of the conductive feature with the top surface of the dielectric layer. The first conductive feature may be electrically connected to a feature within the substrate through a via. For example, the first conductive feature may be connected to a source, drain, or gate feature of a transistor within the substrate. In examples in which the substrate includes dielectric layers which are also part of the BEOL, the first conductive feature may connect to an underlying conductive feature.

The method 400 further includes a process 404 for, in a first process, forming a via (e.g., 116) that contacts the first conductive feature, the via comprising a conductive material. In one example, the via includes ruthenium. The via may be formed within another dielectric layer. The via may be formed by deposition of a conductive material within a trench. The conductive material may be one of a variety of metal materials such as ruthenium, tungsten, cobalt, or copper. In one particular example, the conductive material comprises ruthenium. The ruthenium may be deposited using a first CVD process. The first CVD process may use $Ru_3Co_{12}$ as a precursor. The CVD process may be performed at a temperature within a range of about 100-200 degrees Celsius.

The method 400 further includes a process for forming a CMP process (e.g., 115) to a top surface of the via. The CMP process planarizes the surface of the water so that the top surface of the via is coplanar with the top surface of the dielectric layer. The via directly contacts the underlying feature and thus provides an electrical connection to the underlying first conductive feature. After the CMP process, the via may have a height within a range of 10-30 nanometers. The bottom of the via may have a critical dimension with respect to adjacent vias of about 5-15 nanometers.

The method 400 further includes a process 408 for forming an Interlayer Dielectric (ILD) layer (e.g., 118) on the via. In some examples, the ILD layer also comprises several sublayers. In one example, the ILD layer comprises an etch stop layer (e.g., 118a), a low-k dielectric layer (e.g., 118b), and a hard mask layer (e.g., 118c). In some examples, the ILD layer may include only the etch stop layer and the low-k dielectric layer.

The method 400 further includes a process 412 for forming a trench (e.g., 120) within the ILD layer to expose the via. The trench may be formed using photolithographic patterning techniques. For example, a photoresist may be placed on top of the ILD layer. The photoresist may be used to photolithographically pattern the ILD layer. For example, the photoresist may be exposed to a light source through a photomask. The photomask may then be developed such that the portions of the photoresist where the trench is to be are removed and other portions of the photoresist remain. An etching process may then be applied to the exposed portion of the ILD layer to form the trench.

The method 400 further includes a process 412 for, in a second process, forming within the trench a second conductive feature (e.g., 122) that contacts the via, the second conductive feature comprising a same material as the conductive material. The second conductive feature may also be deposited using the same process used to form the via. Additionally, the second conductive feature may include the same type of conductive material as the via. Specifically, if the via is made of ruthenium, then the second conductive feature may also be made of ruthenium. Ruthenium is one of a number of materials that provides particular advantages in this situation because it can be deposited into the trench without first forming a barrier layer to protect against diffusion of the metal into the ILD layer. The ruthenium may also adhere well to the surface of the ILD layer without having to rely on a barrier or glue layer. By not having a barrier or glue layer, there is no interface between the second conductive feature and the via. Without such an interface, the contact resistance between the via and the second conductive feature is reduced or eliminated.

Figure 5:
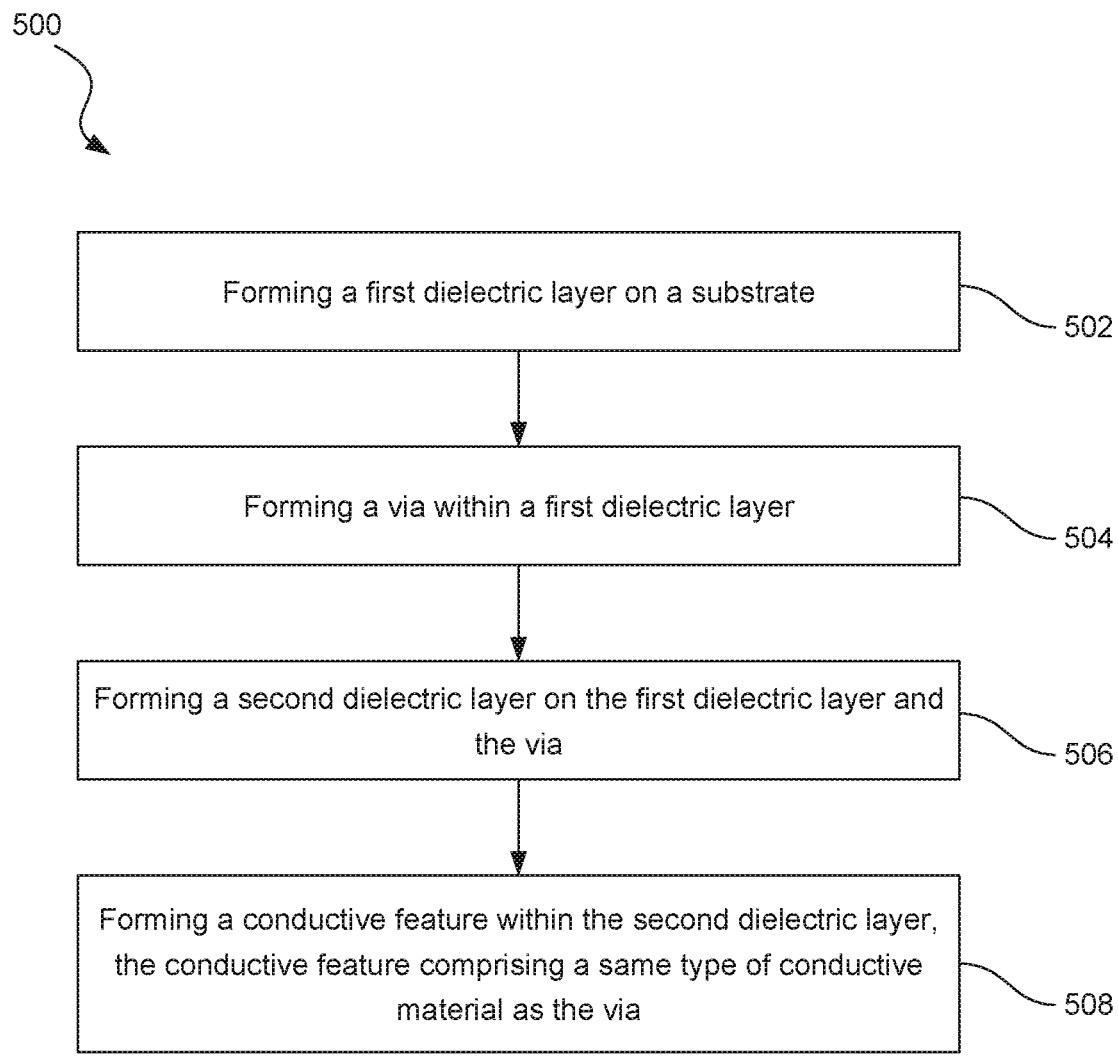
FIG. 5 is a flowchart showing an illustrative method for forming a via and conductive line with an improved contact resistance between the two, according to one example of principles described herein.

FIG. 5 is a flowchart showing an illustrative method for forming a via and conductive line with an improved contact resistance between the two. According to the present example, the method 500 includes a process 502 for forming a first dielectric layer (e.g., 104) on a substrate (e.g. 102). The semiconductor substrate may be a silicon substrate. The semiconductor substrate may be part of a silicon wafer. Other semiconductor materials are contemplated. The substrate may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate may be a single-layer material having a uniform composition. Alternatively, the substrate may include multiple material layers having similar or different compositions suitable for IC device manufacturing. In one example, the substrate may be a silicon-on-insulator (SOI) substrate having a silicon layer formed on a silicon oxide layer. In another example, the substrate may include a conductive layer, a semiconductor layer, a dielectric layer, other layers, or combinations thereof.

The dielectric layer may include two types of sublayers. In one example, the first sublayer (e.g., 104a) is silicon dioxide and the second sublayer (e.g., 104b) is silicon nitride. Other types of dielectric materials are contemplated. The dielectric layer (and thus the sublayers) may be formed through various deposition processes.

The method 500 further includes a process 504 for forming a via (e.g., 116) within a first dielectric layer. In one example, the via includes ruthenium. The via may be formed within another dielectric layer. The via may be formed by deposition of a conductive material within a trench. The conductive material may be one of a variety of metal materials such as ruthenium, tungsten, cobalt, or copper. In one particular example, the conductive material comprises ruthenium. The ruthenium may be deposited using a first CVD process. The first CVD process may use $Ru_3Co_{12}$ as a precursor. The CVD process may be performed at a temperature within a range of about 100-200 degrees Celsius.

The method 500 further includes a process 506 for forming a second dielectric layer (e.g., 110) on the first dielectric layer and the via. The second dielectric layer may also include a number of sublayers. The first sublayer (e.g., 110a) may be silicon dioxide and the second sublayer (e.g., 110b) may be silicon nitride. Other types of dielectric materials are contemplated. The dielectric layer (and thus the sublayers) may be formed through various deposition processes.

The method 500 further includes a process 508 for forming a conductive feature within the second dielectric layer, the conductive feature comprising a same type of conductive material as the via. The second conductive feature may also be deposited using the same type of process used to form the via. However, it is a separate process that is distinct from the process used to form the via. Specifically, other processes are performed between formation of the via and formation of the second conductive feature. For example, deposition of the second dielectric layer is performed after forming the via but before forming the second conductive material.

Additionally, the second conductive feature may include the same type of conductive material as the via. Specifically, if the via is made of ruthenium, then the second conductive feature may also be made of ruthenium. Ruthenium is one of a number of materials that provides particular advantages in this situation because it can be deposited into the trench without first forming a barrier layer to protect against diffusion of the metal into the ILD layer. The ruthenium may also adhere well to the surface of the ILD layer without having to rely on a barrier or glue layer. By not having a barrier or glue layer, there is no interface between the second conductive feature and the via. Without such an interface, the contact resistance between the via and the second conductive feature is reduced or eliminated.

Thus, by applying principles described herein, the contact resistance between a via and a conductive line is improved by reducing or eliminating the interface between the via and the conductive line. Specifically, this advantage is realized by using the same type of conductive material for the via as the conductive line. For example, both the via and the conductive line may both be formed of ruthenium. Ruthenium may be referred to as a barrier-free metal because it is able to be deposited within a dielectric layer without using a barrier layer between the conductive line and the dielectric layer within which it is formed. Thus, using principles described herein, the contact resistance between the via and the conductive line is improved by reducing or eliminating such contact resistance. This allows the circuit to be more efficient and function better.

Moreover, using the fabrication techniques described herein, a structure is produced that is different and distinguishable from structures produced using conventional fabrication techniques. For example, the via will be tapered at a relatively steep angle when using the fabrication techniques described herein. Specifically, the angle between the bottom surface of the via (or top surface of the underlying conductive feature 108) and the via 116 is greater than 85 degrees. Thus, the structure of the via is different than a structure produced using conventional dual damascene processes. Additionally, using the techniques described herein, structures can be produced such that the diameter of the via is greater than the width of the second conductive feature. While the techniques allow for such a structure, other structures may result. For example, the diameter of the via may be similar to the width of the second conductive feature. Or, the diameter of the via may be less than the width of the second conductive feature.

According to one example, a method includes forming a first conductive feature on a substrate, forming a via that contacts the first conductive feature, the via comprising a conductive material, performing a Chemical Mechanical Polishing (CMP) process to a top surface of the via, depositing an Interlayer Dielectric (ILD) layer on the via, forming a trench within the ILD layer to expose the via, and filling the trench with a second conductive feature that contacts the via, the second conductive feature comprising a same material as the conductive material.

According to one example, a method includes forming a first dielectric layer on a substrate, in a first process, forming a via within a first dielectric layer, forming a second dielectric layer on the first dielectric layer and the via, in a second process that is different than the first process, and forming a conductive feature within the second dielectric layer, the conductive feature comprising a same type of conductive material as the via.

According to one example, a semiconductor device includes a substrate, a first dielectric layer formed on the substrate, a first conductive feature formed within the first dielectric layer, a second dielectric layer on the first dielectric layer, a via disposed within the second dielectric layer, the via having a sidewall angle that is greater than 85 degrees from the top surface of the first dielectric layer, a third dielectric layer on the second dielectric layer, and a second conductive feature formed within the third dielectric layer, wherein the second conductive feature comprises a same conductive material as the via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a first oxide layer disposed on a substrate;
a first nitride layer disposed on and interfacing with the first oxide layer;
a second oxide layer disposed on and interfacing with the first nitride layer;
a first conductive feature extending through the first oxide layer, the first nitride layer and the second oxide layer;
a second nitride layer disposed on and interfacing with the second oxide layer;
a third oxide layer disposed on and interfacing with second nitride layer;
a via extending through and interfacing with the second nitride layer and the third oxide layer, wherein the via does not include any barrier layer separating the via from the second nitride layer and the third oxide layer;
a third dielectric layer disposed on and interfacing with the third oxide layer; and
a second conductive feature extending through the third dielectric layer and interfacing with the third dielectric layer and the via, wherein the second conductive feature is formed of the same material as the via, and wherein the second conductive feature does not include any barrier layer separating the second conductive feature from the third dielectric layer.

2. The device of claim 1, wherein the second conductive feature and the via are both formed of ruthenium throughout the second conductive feature and the via.

3. The device of claim 1, further comprising a third nitride layer disposed on the substrate and interfacing with the first oxide layer, and
wherein the first conductive feature interfaces with the third nitride layer.

4. The device of claim 1, wherein the first oxide layer is thicker than the third oxide layer, and
wherein the second nitride layer is thicker than the first nitride layer.

5. The device of claim 1, wherein no barrier layer is disposed along any surface of the via and the second conductive feature.

6. The device of claim 1, wherein the third dielectric layer includes:
an etch stop layer disposed directly on the third oxide layer and interfacing with the second conductive feature;
a low-k dielectric layer disposed directly on the etch stop layer and interfacing with the second conductive feature; and
a hard mask layer disposed directly on the low-k dielectric layer and interfacing with the second conductive feature.

7. The device of claim 1, wherein the second conductive feature is wider and thicker than the via.

8. A device comprising:
a first oxide layer disposed over a substrate;

a first nitride layer disposed over the substrate;

a first conductive feature extending through and interfacing with the first oxide layer and the first nitride layer;

a second oxide layer disposed over the first conductive feature;

a second nitride layer disposed over the first conductive feature;

a via extending through and interfacing with the second oxide layer and the second nitride layer;

a third dielectric layer disposed over the via; and a second conductive feature extending through the third dielectric layer and interfacing with the third dielectric layer and the via, wherein the second conductive feature is formed of the same material throughout the second conductive feature.

9. The device of claim 8, wherein the second conductive feature and the via are formed of the same material.

10. The device of claim 8, wherein the first oxide layer has a different thickness than the second oxide layer, and
wherein the first nitride layer has a different thickness than the second nitride layer.

11. The device of claim 8, wherein the second nitride layer is thicker than the first nitride layer and wherein the first oxide layer is thicker than the second oxide layer.

12. The device of claim 8, wherein the via does not include any barrier layer separating the via from the second oxide layer and the second nitride layer, and
wherein the second conductive feature does not include any barrier layer separating the second conductive feature from the third dielectric layer.

13. The device of claim 8, wherein the third dielectric layer includes:
an etch stop layer disposed directly on the second dielectric layer and interfacing with the second conductive feature, and
a low-k dielectric layer disposed directly on the etch stop layer and interfacing with the second conductive feature.

14. The device of claim 8, further comprising a third nitride layer interfacing with the first oxide layer and the substrate,
wherein the first nitride layer interfaces with the first oxide layer, and
wherein the third nitride layer is thicker than the first nitride layer.

15. A device comprising:
a first dielectric layer disposed on a substrate, the first dielectric layer having a first thickness;

a first conductive feature disposed within the first dielectric layer;

a second dielectric layer disposed on the first dielectric layer, the second dielectric having a second thickness that is different than the first thickness;

a via disposed within the second dielectric layer and interfacing with the first conductive feature;

a third dielectric layer disposed on the second dielectric layer, the third dielectric layer having a third thickness that is different from the first and second thicknesses; and a metal layer disposed within the third dielectric layer without a barrier layer being disposed around the metal layer such that the metal layer directly contacts the third dielectric layer and the via, the metal layer being formed of the same material throughout the metal layer.

16. The device of claim 15, wherein the first thickness in greater than the second thickness and the second thickness is less than the third thickness.

17. The device of claim 15, wherein the metal layer and the via are formed entirely of the same metal material.

18. The device of claim 15, wherein the first dielectric layer includes a portion disposed directly under the first conductive feature such that the first conductive feature is electrically isolated from the substrate.

19. The device of claim 15, wherein the via interfaces with the second dielectric layer,
wherein the via does not include any barrier layer separating the via from the second dielectric layer.

20. The device of claim 15, wherein the third dielectric layer includes:
an etch stop layer disposed directly on the second dielectric layer;
a dielectric material layer disposed directly on the etch stop layer; and
a hard mask layer disposed directly on the dielectric material layer, and
wherein the metal layer has a first sidewall and an opposing second sidewall,
wherein the etch stop layer directly contacts the first and second sidewalls of the metal layer,
wherein the dielectric material layer directly contacts the first and second sidewalls of the metal layer, and
wherein the hard mask layer directly contacts the first and second sidewalls of the metal layer.

* * * * *